US010796981B1

(12) United States Patent
Chiang et al.

(10) Patent No.: US 10,796,981 B1
(45) Date of Patent: Oct. 6, 2020

(54) CHIP TO LEAD INTERCONNECT IN ENCAPSULANT OF MOLDED SEMICONDUCTOR PACKAGE

(71) Applicant: Infineon Technologies AG, Neubiberg (DE)

(72) Inventors: Chau Fatt Chiang, Melaka (MY); Khay Chwan Saw, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/413,059

(22) Filed: May 15, 2019

Related U.S. Application Data

(63) Continuation-in-part of application No. 16/375,479, filed on Apr. 4, 2019.

(51) Int. Cl.
*H01L 23/495* (2006.01)
*H01L 23/48* (2006.01)
(Continued)

(52) U.S. Cl.
CPC .... *H01L 23/49513* (2013.01); *H01L 21/4825* (2013.01); *H01L 21/565* (2013.01);
(Continued)

(58) Field of Classification Search
CPC ..... H01L 23/28; H01L 23/29; H01L 23/3107; H01L 23/49541; H01L 24/09; H01L 21/56; H01L 21/565; H01L 21/4825
(Continued)

(56) References Cited

U.S. PATENT DOCUMENTS 5,437,915 A 8/1995 Nishimura et al.
5,729,433 A 3/1998 Mok
(Continued)

FOREIGN PATENT DOCUMENTS

KR 20120056624 A 6/2012

OTHER PUBLICATIONS

Danny Koh, Cher Hau, et al., "Formation of Conductive Connection Tracks in Package Mold Body Using Electroless Plating", U.S. Appl. No. 15/816,471, filed Nov. 17, 2017, 1-42.
(Continued)

*Primary Examiner* — Nitin Parekh
(74) *Attorney, Agent, or Firm* — Murphy, Bilak & Homiller, PLLC

(57) ABSTRACT

A semiconductor package includes an electrically insulating first encapsulant body having an upper surface, a first semiconductor die encapsulated within the first encapsulant body, the first semiconductor die having a main surface with a first conductive pad that faces the upper surface of the first encapsulant body, a plurality of electrically conductive leads, each of the leads having interior ends that are encapsulated within the first encapsulant body and outer ends that are exposed from the first encapsulant body, and a first direct electrical connection between the first conductive pad and the interior end of a first lead from the plurality. The first direct electrical connection includes a first conductive track formed in the upper surface of the first encapsulant body. The first encapsulant body includes a laser activatable mold compound. The first conductive track is formed in a first laser activated region of the laser activatable mold compound.

20 Claims, 14 Drawing Sheets

(51) Int. Cl.
*H01L 23/00* (2006.01)
*H01L 21/48* (2006.01)
*H01L 21/56* (2006.01)
*H01L 23/31* (2006.01)

(52) U.S. Cl.
CPC ........ *H01L 23/3107* (2013.01); *H01L 23/481* (2013.01); *H01L 23/49541* (2013.01); *H01L 24/09* (2013.01)

(58) Field of Classification Search
USPC ....................................................... 257/666
See application file for complete search history.

(56) References Cited

U.S. PATENT DOCUMENTS

| | | | |
|---|---|---|---|
| 6,479,322 B2 | 11/2002 | Kawata et al. | |
| 7,633,765 B1 | 12/2009 | Scanlan et al. | |
| 7,944,034 B2 | 5/2011 | Gerber et al. | |
| 8,026,589 B1 | 9/2011 | Kim et al. | |
| 8,759,956 B2 | 6/2014 | Soller | |
| 9,224,688 B2 | 12/2015 | Chuang et al. | |
| 9,230,883 B1 | 1/2016 | Hiner et al. | |
| 9,559,064 B2 | 1/2017 | Chen et al. | |
| 9,564,409 B2 | 2/2017 | Seddon et al. | |
| 10,264,664 B1* | 4/2019 | Vinciarelli | H05K 3/0014 |
| 2004/0061213 A1 | 4/2004 | Karnezos | |
| 2005/0167814 A1* | 8/2005 | Beroz | H01L 23/3128 257/687 |
| 2007/0080437 A1 | 4/2007 | Marimuthu et al. | |
| 2007/0257340 A1 | 11/2007 | Briggs et al. | |
| 2009/0321956 A1* | 12/2009 | Sasaki | H01L 24/82 257/777 |
| 2011/0221005 A1 | 9/2011 | Luo et al. | |
| 2012/0108013 A1 | 5/2012 | Fujisawa et al. | |
| 2013/0280826 A1* | 10/2013 | Scanlan | H01L 23/544 438/15 |
| 2014/0332942 A1 | 11/2014 | Kanemoto | |
| 2015/0187608 A1 | 7/2015 | Ganesan et al. | |
| 2015/0279778 A1 | 10/2015 | Camacho et al. | |
| 2015/0380384 A1 | 12/2015 | Williams et al. | |
| 2016/0005675 A1 | 1/2016 | Tong | |
| 2017/0092567 A1 | 3/2017 | Vincent et al. | |
| 2017/0125355 A1 | 5/2017 | Su et al. | |
| 2017/0256472 A1 | 9/2017 | Chan et al. | |
| 2017/0317015 A1* | 11/2017 | Lee | H01L 24/41 |
| 2018/0124922 A1 | 5/2018 | Ji et al. | |
| 2018/0211946 A1 | 7/2018 | Shiu | |
| 2018/0358292 A1* | 12/2018 | Kong | H01L 21/56 |
| 2019/0115287 A1 | 4/2019 | Derai et al. | |
| 2019/0259629 A1* | 8/2019 | Ziglioli | H01L 21/56 |

OTHER PUBLICATIONS

Saw, Khay Chwan, et al., "Chip to Chip Interconnect in Encapsulant of Molded Semiconductor Package", U.S. Appl. No. 16/375,479, filed Apr. 4, 2019, 1-27.

Schmalzl, Stefan, et al., "Semiconductor Package Having a Laser-Activatable Mold Compound", U.S. Appl. No. 16/213,593, filed Dec. 7, 2018, 1-36.

Unknown, Author, "Dual Exposed Pad PKG", Amkor Technology, 2010, 1-4.

Unknown, Author, "EpoxyClay Steel", Pioneer Adhesives, Inc., Accessed online at http://www.pioneer-adhesives.com/product/epoxyclay-steel on Dec. 11, 2018, 1-2.

Unknown, Author, "Laser-Direct-Structuring (LDS) of 3D-MIDs", LPKF Laser & Electronics AG, https://www.youtube.com/watch?v=VLL9NEA-9PI, Jun. 14, 2010.

Unknown, Author, "MicroLeadFrame® (MLF | QFN | VQFN | LFCSP | DFN | LPCC)", Amkor Technology, https://www.amkor.com/go/qfn, accessed Aug. 10, 2017, 1-3.

Unknown, Author., "Polymer Clay FAQ", Polymer Clay Web, 2011, Accessed online at http://www.polymerclayweb.com/faq.aspx on Dec. 7, 2018, 1-5.

Unknown, Author, "SO8-FL (Flat Lead) Power Discrete", Amkor Technology, https://www.amkor.com/go/packaging/allpackages/so8/so8flflatleadpowerdiscrete, accessed Aug. 10, 2017, 1-2.

Unknown, Author, "This is Mouldable Glue", Sugru, Accessed online at https://sugru.com/about on Dec. 7, 2018, 1-9.

Unknown, Author, "TSON8-FL (Flat Lead) Power Discrete", Amkor Technology, https://www.amkor.com/go/packaging/all-packages/tson8/tson8-fl-flat-lead-power-discrete, accessed Nov. 16, 2017, 1-2.

* cited by examiner

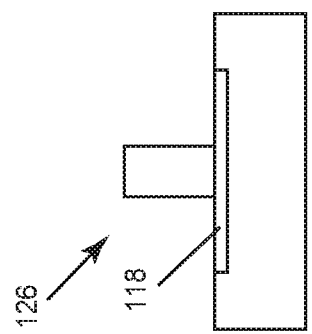
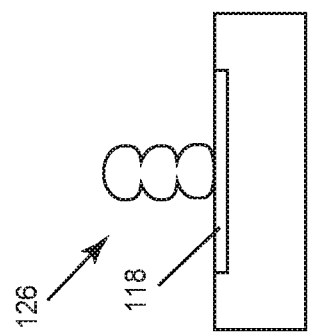
FIGURE 3

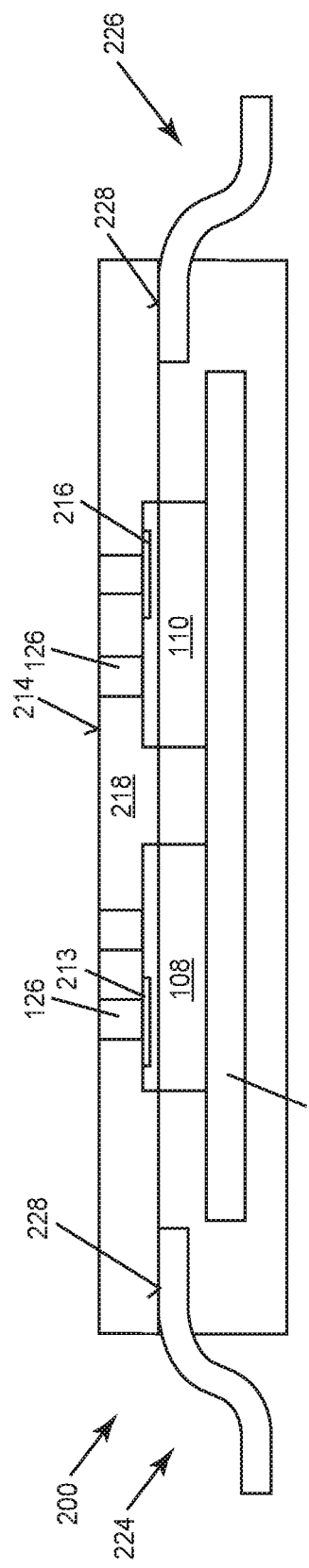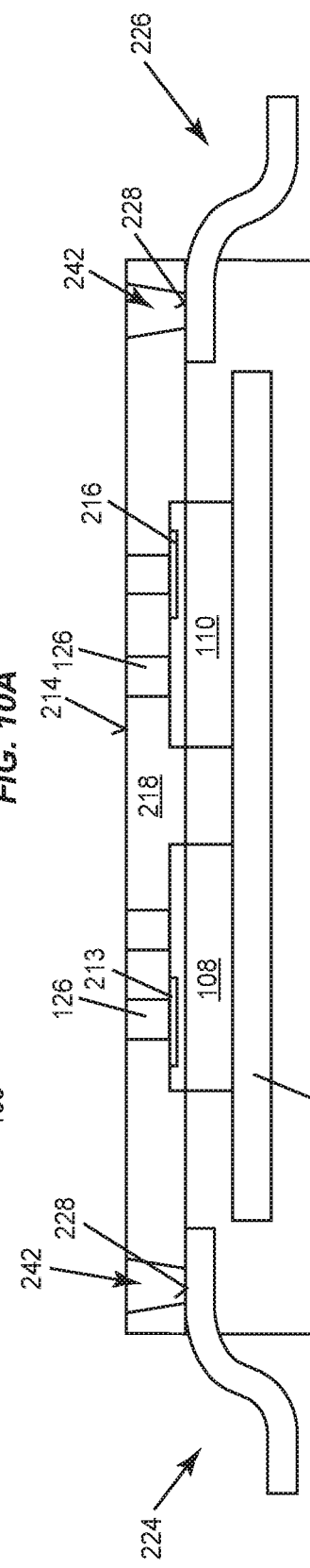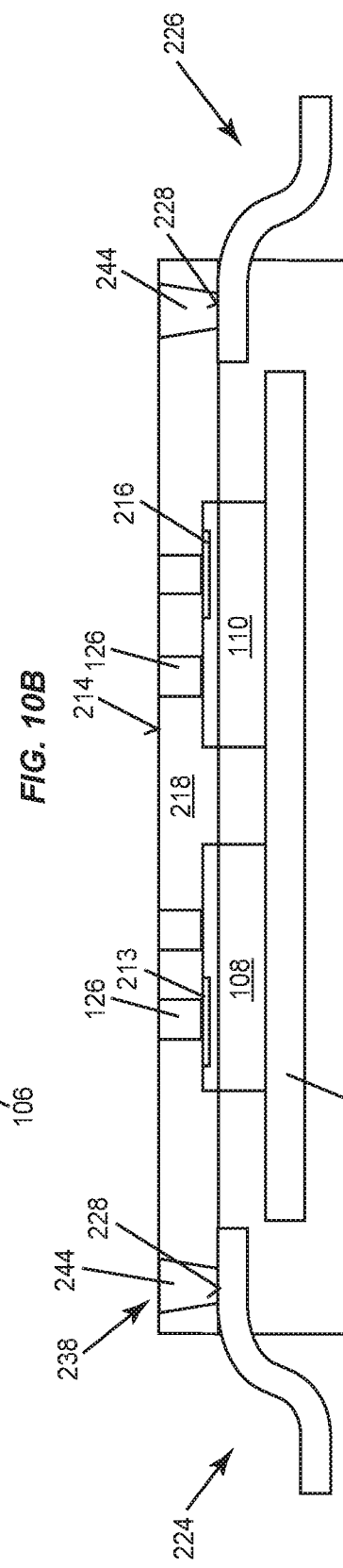
FIGURE 10

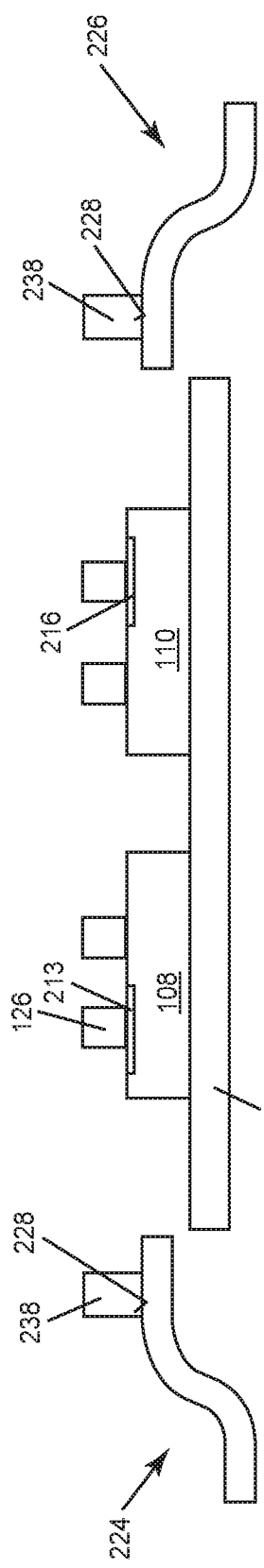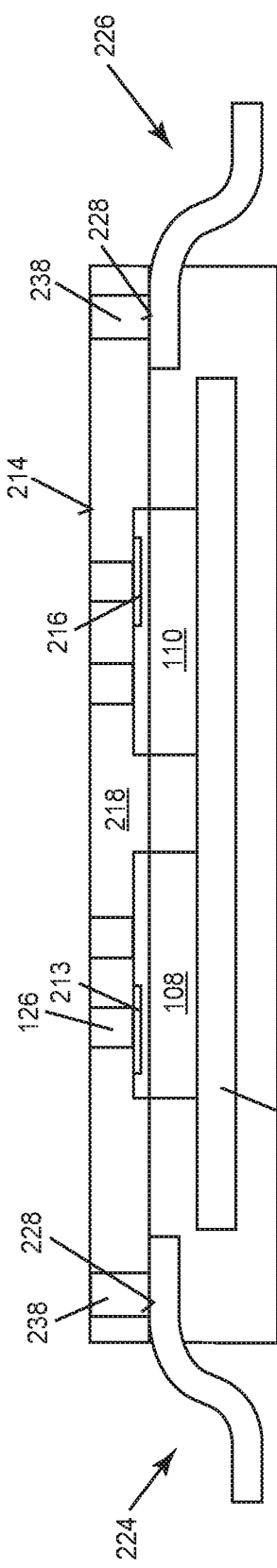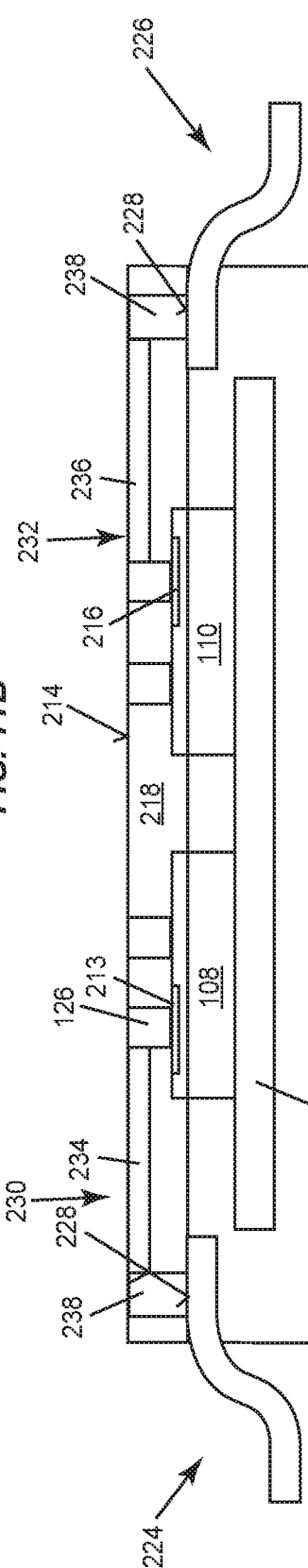

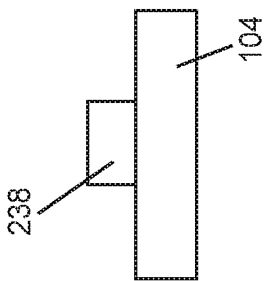
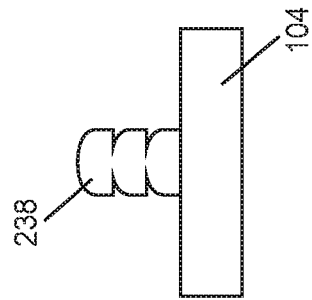
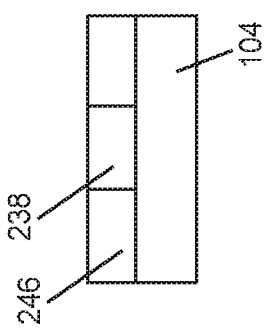
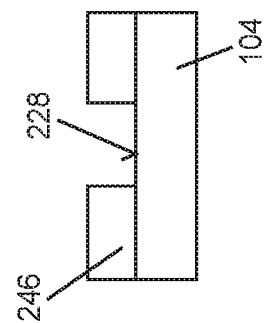
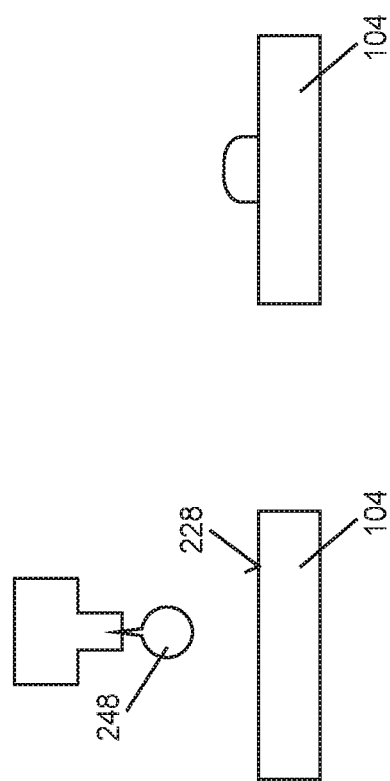
FIG. 12A
FIG. 12B
FIG. 12C
FIG. 12D
FIG. 12E
FIG. 12F
FIGURE 12

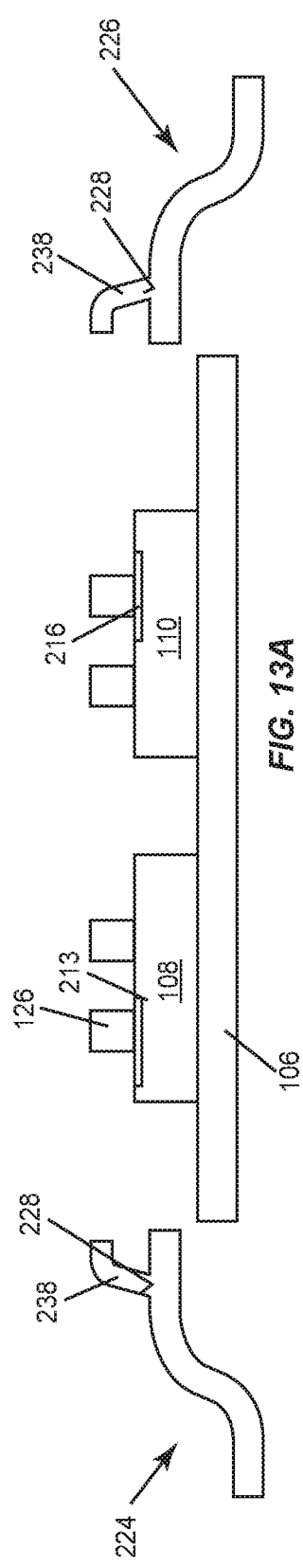
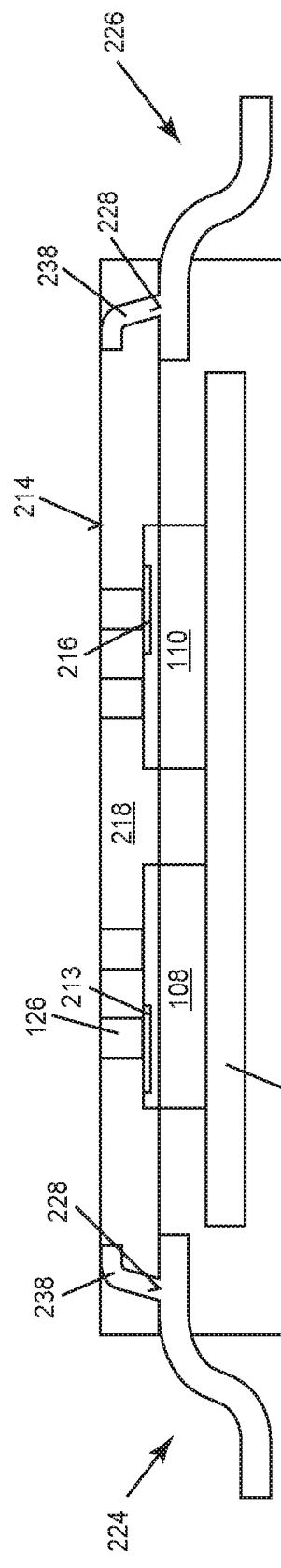
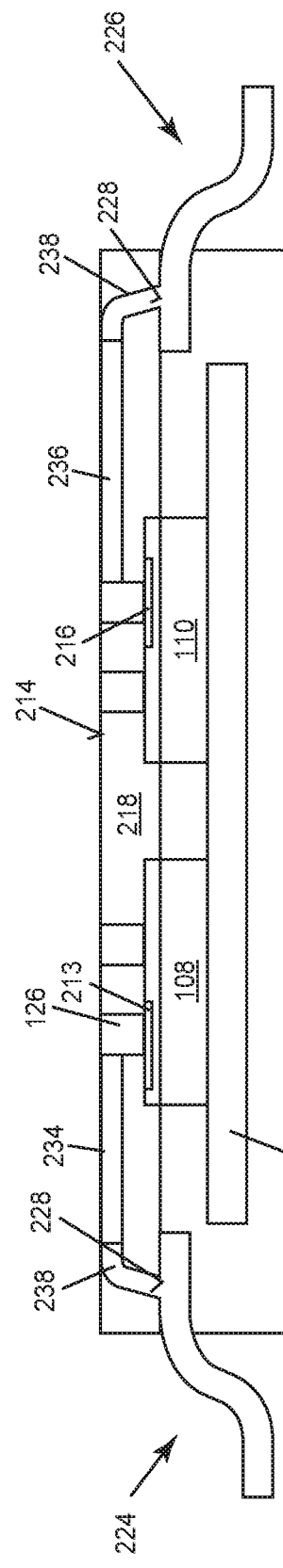
FIGURE 13

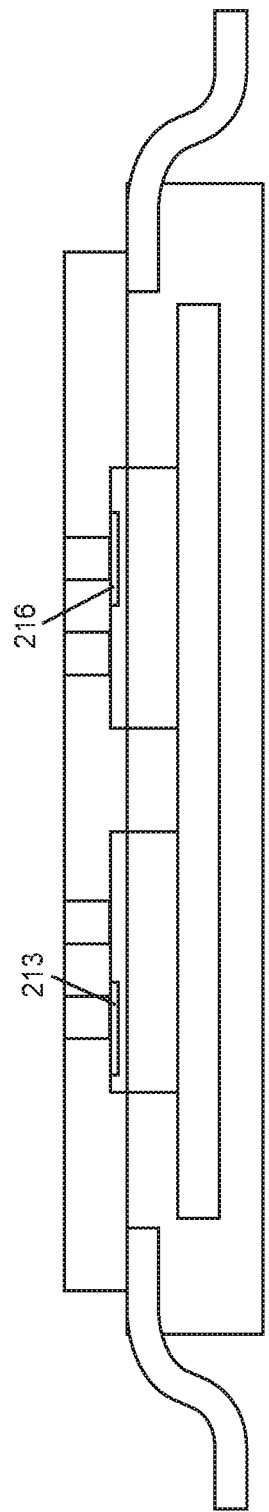
*FIG. 14A*
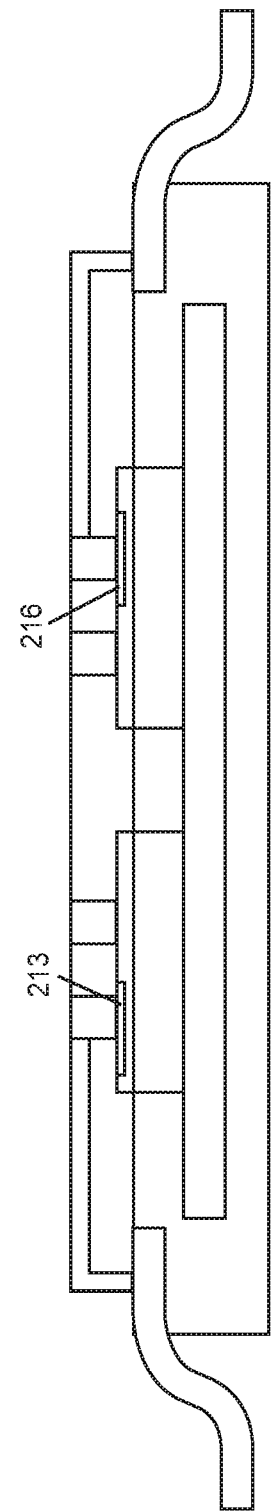
*FIG. 14B*
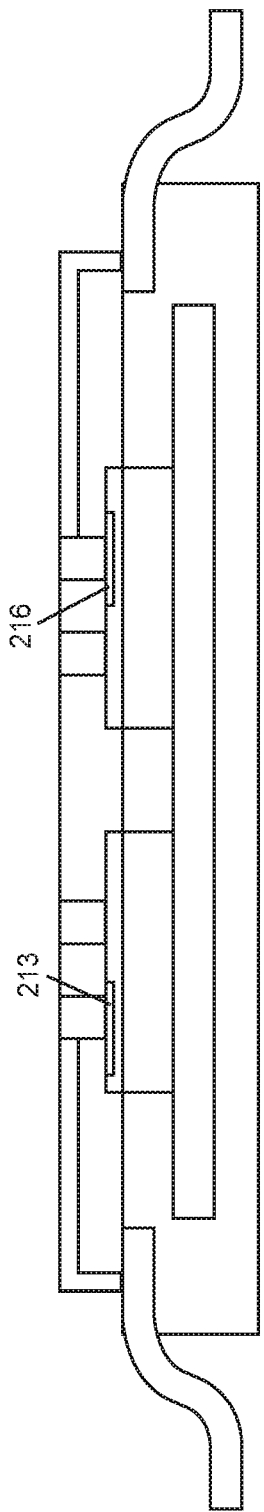
*FIG. 14C*
*FIGURE 14*

CHIP TO LEAD INTERCONNECT IN ENCAPSULANT OF MOLDED SEMICONDUCTOR PACKAGE

PRIORITY CLAIM

This Application is a continuation-in-part of and claims priority to U.S. application Ser. No. 16/375,479 filed Apr. 4, 2019, the content of which is incorporated by reference herein in its entirety.

TECHNICAL FIELD

Embodiments of this invention relate to a semiconductor package and the methods thereof.

BACKGROUND

A prevalent trend in semiconductor applications is to reduce the size of a particular semiconductor device and/or increase the functional capability of a particular semiconductor device without increasing its size. This scaling trend results in semiconductor dies with densely arranged bond pads. These semiconductor dies create design challenges with respect to device packaging. In particular, packaging solutions that provide unique electrical connections for each terminal of a semiconductor die with densely arranged bond pads create challenges. Conventional packaging interconnect structures, such as bond wires, clips, ribbons, etc., may be ineffective and/or performance limiting for these electrical connections.

SUMMARY

A packaged semiconductor device is disclosed. According to an embodiment, the packaged semiconductor device includes an electrically insulating encapsulant body having an upper surface, a first semiconductor die encapsulated within the encapsulant body, the first semiconductor die having a main surface with a first conductive pad that faces the upper surface of the encapsulant body, a second semiconductor die encapsulated within the encapsulant body and disposed laterally side by side with the first semiconductor die, the second semiconductor die having a main surface with a second conductive pad that faces the upper surface of the encapsulant body, and a first conductive track that is formed in the upper surface of the encapsulant body and electrically connects the first conductive pad to the second conductive pad. The encapsulant body includes a laser activatable mold compound.

Separately or in combination, a first vertical interconnect structure is disposed on the first conductive pad, and a second vertical interconnect structure that is disposed on the second conductive pad, the first and second conductive pads are covered by material of the encapsulant body, and the first and second vertical interconnect structures each comprise outer ends that are exposed from the encapsulant body at the upper surface Separately or in combination, the first conductive track directly connects with the outer ends of the first and second vertical interconnect structures.

Separately or in combination, the first vertical interconnect structure is a wire stud bump that is attached to the first conductive pad.

Separately or in combination, the second vertical interconnect structure is a metal pillar that is attached to the second conductive pad.

Separately or in combination, a second conductive track is formed in the upper surface of the encapsulant body, and the second conductive track is formed in a second laser activated region of the laser activatable mold compound.

Separately or in combination, the main surface of the first semiconductor die comprises a third conductive pad, the main surface of the second semiconductor die comprises a fourth conductive pad, and the second conductive track electrically connects the third conductive pad to the fourth conductive pad.

Separately or in combination, the first conductive track comprises an elongated span that extends in a first direction, the second conductive track comprises an elongated span that extends in a second direction, and the first and second directions are angled relative to one another.

Separately or in combination, a protective layer that covers the first conductive track, and the protective layer comprises an electrically insulating material different from the laser activatable mold compound.

Separately or in combination, the packaged semiconductor device further comprises a die paddle and a plurality of electrically conductive leads extending away from the die paddle, the first and second semiconductor dies are mounted on laterally adjacent regions of the die paddle, and the upper surface of the encapsulant body is opposite from the die paddle.

Separately or in combination, the first and second semiconductor dies are laterally separated from one another by a gap, a first portion of the encapsulant body fills the gap, and the first conductive track is formed on the first portion of the encapsulant body.

According to another embodiment, the semiconductor package includes an electrically insulating first encapsulant body comprising an upper surface, a first semiconductor die encapsulated within the first encapsulant body, the first semiconductor die comprising a main surface with a first conductive pad that faces the upper surface of the first encapsulant body, a plurality of electrically conductive leads, each of the leads comprising interior ends that are encapsulated within the first encapsulant body and outer ends that are exposed from the first encapsulant body, and a first direct electrical connection between the first conductive pad and the interior end of a first lead from the plurality. The first direct electrical connection comprises a first conductive track that is formed in the upper surface of the first encapsulant body. The first encapsulant body comprises a laser activatable mold compound. The first conductive track is formed in a first laser activated region of the laser activatable mold compound.

Separately or in combination, the interior end of the first lead comprises a first surface that is vertically below the main surface of the first semiconductor die, and the first direct electrical connection comprises a conductive connector extending vertically between the first surface of the first lead and the upper surface of the first encapsulant body.

Separately or in combination, the conductive connector extends through the first encapsulant body and directly contacts the first conductive track at the upper surface of the first encapsulant body.

Separately or in combination, the first encapsulant body is formed to include an opening between the upper surface of the encapsulant and the first surface of the first lead, and the conductive connector comprises a via formed in the opening.

Separately or in combination, the conductive connector is a conductive stud or pillar.

Separately or in combination, the first encapsulant body is formed to include a side surface that extends between the upper surface of the first encapsulant body and the first surface of the first lead, and the conductive connector is an extension of the first conductive track that is formed on the side surface.

Separately or in combination, the first conductive connector is an integrally formed section of the lead that vertically extends from the first surface of the first lead to the upper surface of the first encapsulant body.

Separately or in combination, the packaged device further comprises a second electrically insulating encapsulant body formed on the upper surface of the first encapsulant body, wherein the second encapsulant body covers the first conductive track.

Separately or in combination, the semiconductor device further comprises a second semiconductor die encapsulated within the first encapsulant body and mounted on a carrier laterally side by side with the first semiconductor die, the second semiconductor die comprising a main surface with a second conductive pad that faces the upper surface of the first encapsulant body, a second direct electrical connection between the second conductive pad and the interior end of a second lead from the plurality, wherein the second direct electrical connection comprises a second conductive track that is formed in the upper surface of the first encapsulant body, and wherein the second conductive track is formed in a second laser activated region of the laser activatable mold compound.

Separately or in combination, the semiconductor device further comprises a discrete passive device mounted on the upper surface of the first encapsulant body, a third direct electrical connection between the discrete passive device and the interior end of a third lead from the plurality, the third direct electrical connection comprises a third conductive track that is formed in the upper surface of the first encapsulant body, and the third conductive track is formed in a third laser activated region of the laser activatable mold compound.

A method of forming a packaged semiconductor device is disclosed. According to an embodiment of the method, a first semiconductor die that comprises a main surface with a first conductive pad is provided, a second semiconductor die that comprises a main surface with a second conductive pad is provided, the first and second semiconductor dies are encapsulated such that the second semiconductor die is disposed laterally side by side with the first semiconductor die and such that the main surfaces of the first and second semiconductor dies each face an upper surface of the encapsulant body, and a first conductive track in the upper surface of the encapsulant body that electrically connects the first conductive pad to the second conductive pad is formed. The encapsulant body includes a laser activatable mold compound. The first conductive track is formed in a first laser activated region of the laser activatable mold compound.

Separately or in combination, forming the first conductive track comprises directing a laser on the laser activatable mold compound thereby forming the first laser activated region, and performing a plating process that forms conductive material in the first laser activated region.

Separately or in combination, the plating process is an electroless liquid plating process.

Separately or in combination, the method further includes providing a first vertical interconnect structure on the first conductive pad before the encapsulating, providing a second vertical interconnect structure on the second conductive pad before the encapsulating, the encapsulating covers the first and second conductive pads with material of the encapsulant body, and after the encapsulating, outer ends of the first and second vertical interconnect structures are exposed at the upper surface of the encapsulant body.

Separately or in combination, the encapsulating of the first and second semiconductor dies comprises completely covering the first vertical interconnect structures with material of the encapsulant body, and the method further comprises performing a thinning process after the encapsulating, and the thinning process removes material from the upper surface of the encapsulant body until the outer ends of the first and second vertical interconnect structures are exposed from the encapsulant body Separately or in combination, encapsulating the first and second semiconductor dies comprises an injection molding process, and the injection molding process comprises using an injection cavity that is dimensioned to cover the main surfaces of the first and second semiconductor chips with liquified molding material while exposing the outer ends of the first and second vertical interconnect structures from the liquified molding material.

Separately or in combination, the first conductive track is formed to directly connect with the outer ends of the first and second vertical interconnect structures.

Separately or in combination, the method further includes forming a protective layer that covers the first conductive track, and the protective layer comprises an electrically insulating material different from the laser activatable mold compound.

Separately or in combination, the method further includes providing a die paddle with a plurality of electrically conductive leads extending away from the die paddle, attaching a lower surface of the first semiconductor die that is opposite from the main surface of the first semiconductor die to a first lateral region of the die paddle, attaching a lower surface of the second semiconductor die that is opposite from the main surface of the second semiconductor die to a second lateral region of the die paddle that is laterally adjacent to the first lateral region, and the upper surface of the encapsulant body is opposite from the die paddle.

According to another embodiment of a method of forming a packaged semiconductor device, a first semiconductor die comprising a main surface with a first conductive pad, a plurality of electrically conductive leads is provided, an electrically insulating first encapsulant body that encapsulates the first semiconductor die and the plurality of leads such the first conductive pad faces an upper surface of the first encapsulant body, and such that interior ends of the leads are encapsulated within the first encapsulant body and outer ends of the leads are exposed from the first encapsulant body is formed, and a first direct electrical connection between the first conductive pad and the interior end of a first lead from the plurality is formed. Forming the first direct electrical connection comprises forming a first conductive track in the upper surface of the first encapsulant body. The first encapsulant body comprises a laser activatable mold compound. The first conductive track is formed in a first laser activated region of the laser activatable mold compound.

Separately or in combination, forming the first conductive track comprises directing a laser on the laser activatable mold compound thereby forming the first laser activated region, and performing a plating process that forms conductive material in the first laser activated region.

Separately or in combination, the interior end of the first lead comprises a first surface that is vertically below the main surface of the first semiconductor die, and forming the first direct electrical connection comprises providing a conductive connector extending vertically between the first surface of the first lead and the upper surface of the first encapsulant body.

Separately or in combination, the conductive connector is provided within the first encapsulant body prior to forming the first conductive track, and forming the first conductive track comprises forming the first laser activated region to meet an exposed end of the conductive connector at the upper surface of the first encapsulant body.

Separately or in combination, providing the conductive connector comprises forming a conductive bump or pillar on the first surface of the first lead before forming the first encapsulant body, and wherein forming the first encapsulant body comprises encapsulating the conductive bump or pillar.

Separately or in combination, providing the conductive connector comprises, after forming the first encapsulant body, drilling an opening in the first encapsulant body that extends from the upper surface of the first encapsulant body to the first surface of the first lead, and filling the opening with a conductive via.

Separately or in combination, providing the conductive connector comprises providing the first lead to include an integrally formed section that vertically extends above the first surface of the first lead, and wherein forming the first conductive track comprises forming the first laser activated region to meet an exposed end of the integrally formed section at the upper surface of the first encapsulant body.

Separately or in combination, the first encapsulant body is formed such that a side surface of the first encapsulant body extends between the upper surface of the first encapsulant body and the first surface of the first lead, wherein forming the first conductive track comprises forming the first laser activated region to extend from the upper the first encapsulant body to the first surface of the first lead, and the conductive connector is provided by an extension of the first conductive track that is formed on the side surface.

Separately or in combination, the method further comprises providing a second semiconductor die mounted on a carrier laterally side by side with the first semiconductor die, the second semiconductor die comprising a main surface with a second conductive pad, encapsulating the second semiconductor die with the first encapsulant body, forming a second direct electrical connection between the second conductive pad and the interior end of a second lead from the plurality, wherein the second direct electrical connection comprises a second conductive track that is formed in the upper surface of the first encapsulant body, and wherein the second conductive track is formed in a second laser activated region of the laser activatable mold compound.

Separately or in combination, the method further includes mounting a discrete passive device on the upper surface of the first encapsulant body, forming a third direct electrical connection between the discrete passive device and the interior end of a third lead from the plurality, wherein the third direct electrical connection comprises a third conductive track that is formed in the upper surface of the first encapsulant body, and wherein the third conductive track is formed in a third laser activated region of the laser activatable mold compound.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1A and 1B, illustrates initial steps in a method of forming a packaged semiconductor device. FIG. 1A illustrates providing a carrier, and FIG. 1B illustrates mounting first and second semiconductor dies on a die attach surface of the carrier.

FIG. 3, which includes FIGS. 3A and 3B, illustrates various embodiments of a raised conductive conductor that can be provided on the conductive bond pads. FIG. 3A illustrates a wire stud bump configuration, and FIG. 3B illustrates a metal pillar configuration.

FIG. 10, which includes FIGS. 10A, 10B and 10C, illustrates selected steps for forming laser activated conductive tracks that form interconnections to package leads, according to an embodiment. FIG. 10A illustrates encapsulation, FIG. 10B illustrates drilling via openings, and FIG. 10O illustrates filling the via openings with conductive vias.

FIG. 11, which includes FIGS. 11A, 11B and 11O, illustrates selected steps for forming laser activated conductive tracks that form interconnections to package leads, according to another embodiment. FIG. 11A illustrates forming a stud bump or pillar, FIG. 11B illustrates encapsulation, and FIG. 11O illustrates laser activation.

FIG. 12, which includes FIGS. 12A, 12B, 12O, 12D, 12E and 12F, illustrates selected steps for forming a stud bump or pillar, according to an embodiment. FIG. 12A illustrates forming a mask, FIG. 12B filling an opening in the mask, and FIG. 12O illustrates removing the mask, FIG. 12D illustrates depositing a droplet, FIG. 12E illustrates hardening the droplet, and FIG. 12F illustrates hardening the droplet.

FIG. 13, which includes FIGS. 13A, 13B and 13O, illustrates selected steps for forming laser activated conductive tracks that form interconnections to package leads, according to another embodiment. FIG. 13A illustrates forming a lead with a raised vertical portion, FIG. 13B illustrates encapsulation, and FIG. 13O illustrates laser activation.

FIG. 14, which includes FIGS. 14A, 14B and 14O, illustrates selected steps for forming laser activated conductive tracks that form interconnections to package leads, according to another embodiment. FIG. 14A illustrates forming an encapsulant body to expose connection portions of the leads, FIG. 14B illustrates laser activation, and FIG. 14C illustrates plating the laser activated regions.

DETAILED DESCRIPTION

The embodiments described herein provide a semiconductor package with a wiring layer formed in a top side of the encapsulant body. In an embodiment, the top side wiring layer is used to electrically connect two or more encapsulated semiconductor dies together. The top side wiring layer can be provided by conductive tracks that are formed by laser patterning technique. According to this technique, the encapsulant body includes a laser-activatable mold compound. A laser beam is applied to the laser-activatable mold compound, thereby forming laser-activated regions along defined tracks. These laser-activated regions provide a seed for a subsequent plating process that forms conductive tracks on the encapsulant body. These conductive tracks can be used in combination with raised conductive connections, e.g., bumps, pillars etc., to provide complete electrical connections between the bond pads of encapsulated semiconductor dies. Additionally, due to the high resolution and geometric flexibility of the laser patterning technique, the top side wiring layer described herein offers high density interconnect capability that can be combined with existing interconnect techniques to meet the interconnect requirements of modern semiconductor devices. Additionally, the conductive tracks can advantageously be used to provide logical interconnect between two dies of lower current/voltage signals, whereas high current/voltage signals, e.g., power signal, can be distributed by thicker leads of the packaged device.

Figure 1:
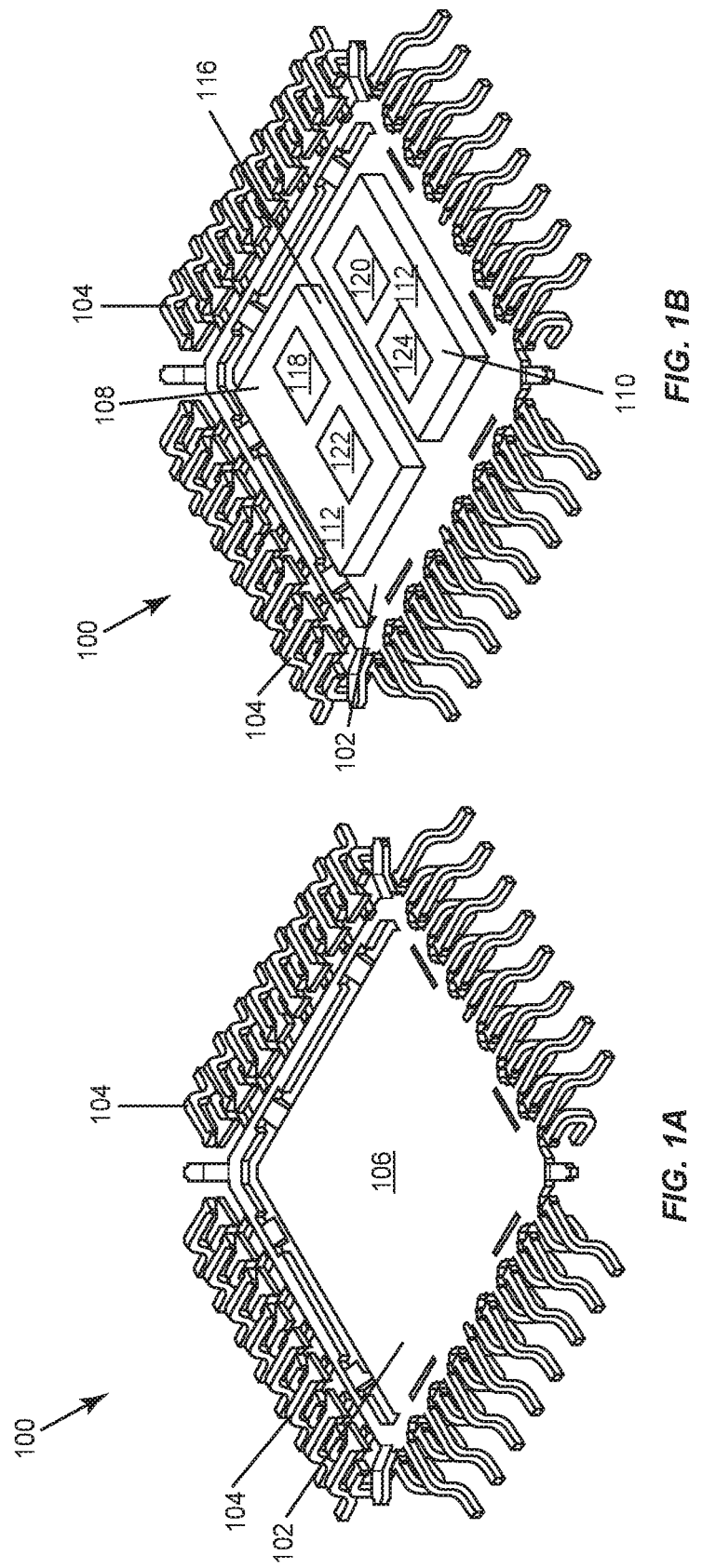
FIG. 1, which includes

Referring to FIG. 1, a carrier structure 100 is depicted, according to an embodiment. In this embodiment, the carrier structure 100 is provided by a lead frame, wherein the lead frame includes a centrally located die paddle 102 and a plurality (i.e., two or more) of electrically conductive leads 104 that extend away from the die paddle 102. The die paddle 102 includes a planar die attach surface 106 that accommodates the mounting of one or more semiconductor dies thereon. According to an embodiment, the die paddle 102 is integrally connected with some of the leads 104 and thus provides a connection point for a terminal of a semiconductor die. Generally speaking, the carrier structure 100 can include conductive metals, such as copper, aluminum, etc., and alloys thereof.

Figure 2:
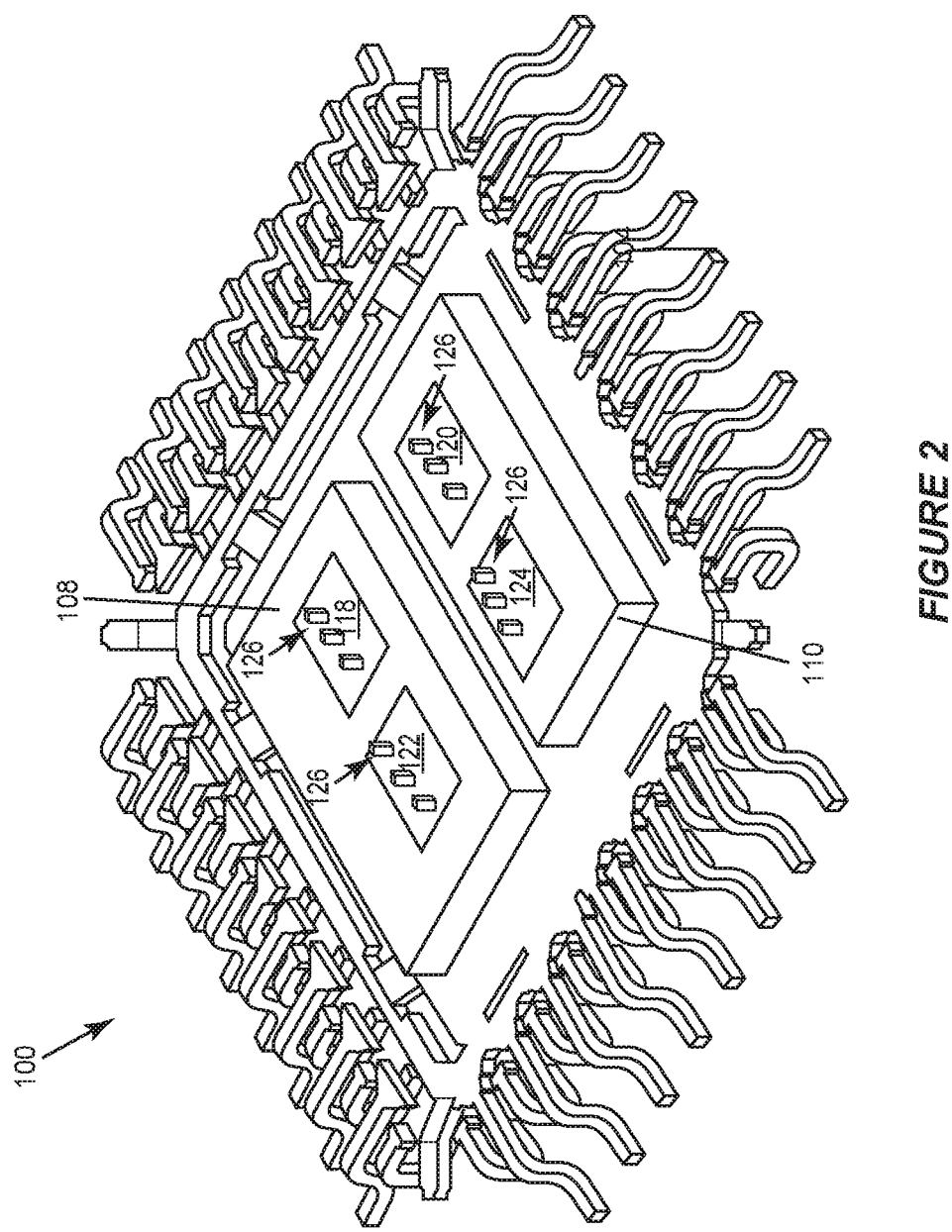
FIG. 2 illustrates providing vertical interconnect structures on conductive bond pads of the first and second semiconductor dies.

Referring to FIG. 2, first and second semiconductor dies 108, 110 are provided on the carrier structure 100. Generally speaking, the first and second semiconductor dies 108, 110 can have a wide variety of device configurations. These device configurations include discrete device configurations, such as HEMT (high electron mobility transistor) devices, diodes, thyristors, etc. These device configurations also include integrated device configurations, such as controllers, amplifiers, etc. These device configurations can include vertical devices, i.e., devices which conduct in a direction perpendicular to the main and rear surfaces of the die, and lateral devices, i.e., devices which conduct in a direction parallel to the main surface of the die.

The first and second semiconductor dies 108, 110 each have a main surface 112, a rear surface 114 (See FIG. 7) that is opposite from the main surface 112, and outer edge sides 116 extending between the main and rear surfaces 112, 114. The main surface 112 of the first semiconductor die 108 includes a first electrically conductive bond pad 118. The main surface 112 of the second semiconductor die 110 includes a second electrically conductive bond pad 120. In the depicted embodiment, the main surface 112 of the first semiconductor die 108 additionally includes a third electrically conductive bond pad 122, and the main surface 112 of the second semiconductor die 110 additionally includes a fourth electrically conductive bond pad 124. These bond pads provide terminal connections (e.g., gate, source, emitter, collector, logical terminals, etc.) for the devices incorporated into the first and second semiconductor dies 108, 110. More generally, the number, size and configuration of bond pads may vary. Optionally, the rear surfaces 114 of the first and/or second semiconductor die 108, 110 may include similarly configured bond pads that provide terminal connections for the respective device.

The second semiconductor die 110 is arranged laterally side by side with the first semiconductor die 108. This means that the outer edge side 116 of the second semiconductor die 110 faces the outer edge side 116 of the first semiconductor die 108. Hence, the first and second semiconductor dies 108, 110 are next to one another in a lateral direction. The lateral direction refers to a direction that is parallel to the main and rear surfaces 112, 114 of the semiconductor dies 108, 110. As shown, the first and second semiconductor dies 108, 110 are laterally separated from one another by a gap. In other configurations, the first and second semiconductor dies 108, 110 can be flush or close to flush against one another.

The first and second semiconductor dies 108, 110 are mounted on laterally adjacent regions of the die attach surface 106. In this configuration, the rear surface 114 of the first semiconductor die 108 faces and is directly attached to a first region of the die attach surface 106, and the rear surface 114 of the second semiconductor die 110 faces and is directly attached to a second region of the die attach surface 106 that is laterally spaced apart from the first region. The rear surfaces 114 of each semiconductor die 108, 110 can be directly attached to the carrier by an adhesive, e.g., solder, conductive glue, etc.

Alternatively, a similar lateral side-by side configuration can be obtained by providing two separate carriers and mounting the first and second semiconductor dies 108, 110 on each carrier.

Referring to FIG. 2, vertical interconnect structures 126 are provided on the conductive pads of the first and second semiconductor dies 108, 110. These vertical interconnect structures 126 vertically extend above the main surfaces 112 of the first and second semiconductor dies 108, 110, and thus represent an uppermost contact surface for the mounted semiconductor dies 108, 110. Various examples of these vertical interconnect structure are shown in more detail in FIG. 3. The vertical interconnect structures 126 can be attached to the bond pads after mounting the semiconductor dies 108, 110 on the die paddle 102. Alternatively, the vertical interconnect structures 126 can be provided on the bond pads before mounting the semiconductor dies 108, 110 on the die paddle 102. Before the encapsulation step to be described below, electrical connections (nor shown) between the leads 104 and both semiconductor dies 108, 110 can be provided using known techniques, such as wire bonding Referring to FIG. 3A, the vertical interconnect structure 126 can be configured as a wire stud bump. These wire stud bumps are made from an electrically conductive material, e.g., copper, gold, tin, silver, aluminium, nickel, etc., and alloys thereof. Generally speaking, these stud bumps can be formed by bonding a ball of conductive material on the conductive pads and clamping the material. As shown, the vertical interconnect structures 126 include a number of bumps (balls) deposited successively on top of another.

Referring to FIG. 3B, the vertical interconnect structure 126 can be configured as a metal pillar. These metal pillars are made from an electrically conductive metal, e.g., copper, gold, aluminium, nickel, etc., and alloys thereof.

More generally, the vertical interconnect structures 126 can be provided by any conductive structure which can be attached to bond pads to provide a vertical extension past the main surface 112 of the semiconductor die.

Referring again to FIG. 2, the vertical interconnect structures 126 provided on the bond pads 118, 122 of the first semiconductor die 108 can have any of the above described configurations. Likewise, the vertical interconnect structures 126 provided on the bond pads 120, 124 of the second semiconductor die 120 can have any of the above described configurations and may have a configuration different from those of the first semiconductor die 108.

Figure 4:
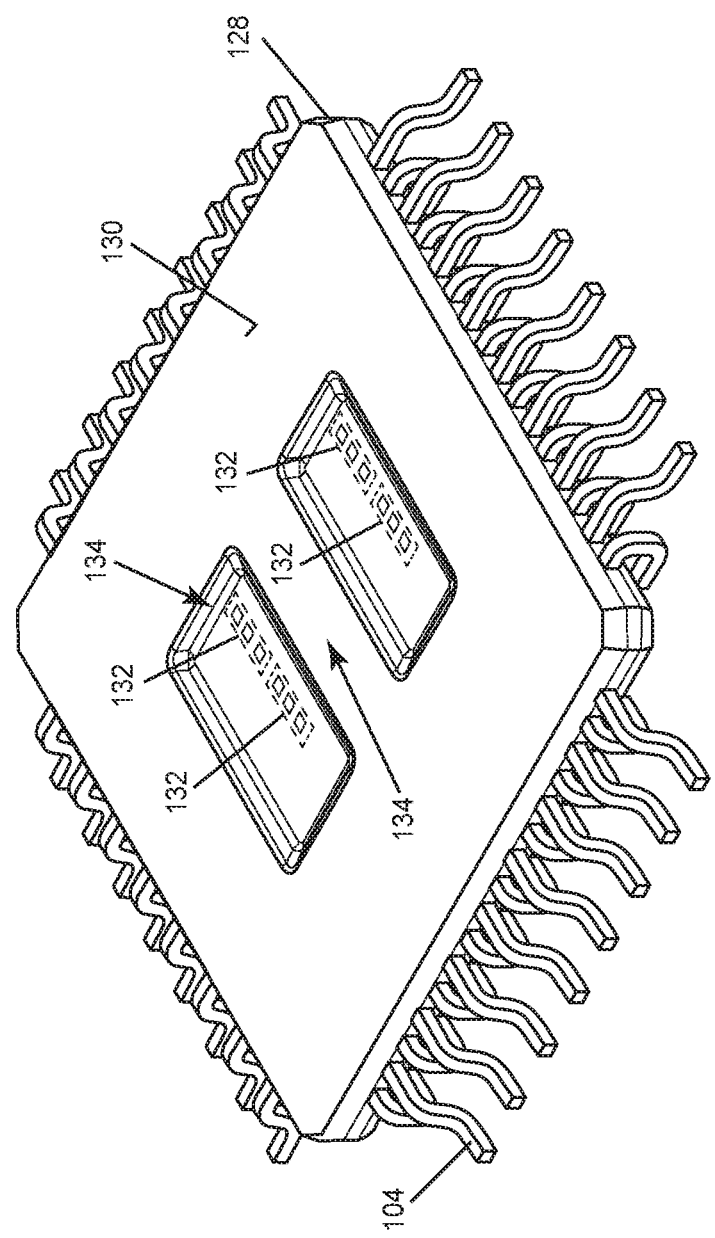
FIG. 4 illustrates forming an encapsulant body that encapsulates the semiconductor dies and exposes outer ends of the vertical interconnect structures at an upper surface.

Referring to FIG. 4, an electrically insulating encapsulant body 128 is formed. The encapsulant body 128 is an electrically insulating structure that seals and protects the semiconductor dies and associated electrical connections, e.g., wire bonds (not shown) between the semiconductor dies 108, 110 and the leads 104. For example, the encapsulant body 128 can include a wide variety of electrically insulating materials such as ceramics, epoxy materials and thermosetting plastics, to name a few. At least a portion of the electrically insulating encapsulant body 128 includes a laser-activatable mold compound. As used herein, a "laser-activatable mold compound" refers to a mold compound that includes at least one additive, e.g., in the form of an organic metal complex which is activated by a physio-chemical reaction induced by a focused laser beam. In addition to the additive, a "laser-activatable mold compound" includes a polymer material as a base material. Examples of these polymers include thermoset polymers having a resin base, ABS (acrylonitrile butadiene styrene), PC/ABS (polycarbonate/acrylonitrile butadiene styrene), PC (polycarbonate), PA/PPA (polyimide/polyphthalamide), PBT (polybutylene terephthalate), COP (cyclic olefin polymer), PPE (polyphenyl ether), LCP (liquid-crystal polymer), PEI (polyethylenimine or polyaziridine), PEEK (polyether ether ketone), PPS (polyphenylene sulfide), etc.

The encapsulant body 128 can be formed using any of a variety of known techniques, such as injection molding, transfer molding, compression molding, etc. The material of the encapsulant body 128 is formed to completely encapsulate, i.e., cover and surround, the semiconductor dies 108, 110 and associated electrical connections between the semiconductor dies 108, 110 and leads 104. In the case that the semiconductor dies 108, 110 are separated from one another by a lateral gap (e.g., as shown in FIG. 2) the encapsulant body 128 can be formed to completely fill this gap.

The encapsulant body 128 includes an upper surface 130. The encapsulant body 128 is formed such that the main surfaces 112 of the first and second semiconductor dies 108, 110 are completely covered by encapsulant material. Put another way, a thickness of encapsulant material is provided between the main surfaces 112 of the first and second semiconductor dies 108, 110 and the upper surface 130 of the encapsulant body 128. Hence, the main surfaces 112 of the first and second semiconductor dies 108, 110 (not shown in FIG. 4) face the upper surface 130 of the encapsulant body 128.

The encapsulant body 128 is formed such that outer ends 132 of the vertical interconnect structures 126, are exposed from the encapsulant material at the upper surface 130 of the encapsulant body 128. This means that the conductive material of the vertical interconnect structures 126 is physically accessible at the upper surface 130 of the encapsulant body 128.

One technique for forming the encapsulant body 128 such that the outer ends 132 of the vertical interconnect structures 126 are exposed at the upper surface 130 of the encapsulant body 128 is as follows. In some embodiments, initially, the encapsulant body 128 is formed to completely cover the vertical interconnect structures 126 with encapsulant material. That is, a thickness of the encapsulant body 128 between the main surfaces 112 of the semiconductor dies 108, 110 and the upper surface 130 is selected to be greater than a height of the vertical interconnect structures 126. Subsequently, a thinning process is performed to remove encapsulant material at the upper surface 130 until the outer ends 132 of the vertical interconnect structures 126 are exposed from the encapsulant body 128. This thinning can be done according to known planarization techniques, e.g., polishing, grinding, etching, etc. In another example, the encapsulant material can be removed by a laser. This laser thinning technique can also provide the laser activation process to be described in further detail below.

Another technique for forming the encapsulant body 128 such that the outer ends 132 of the vertical interconnect structures 126 are exposed at the upper surface 130 of the encapsulant body 128 is as follows. The process for forming the encapsulant body 128 is controlled such that the completed encapsulant body 128 exposes the outer ends 132 of the vertical interconnect structures 126. Put another way, a thickness of the encapsulant material between the main surfaces 112 of the semiconductor dies 108, 110 and the upper surface 130 of the encapsulant body 128 is selected to be less than a height of the vertical interconnect structures 126 above the bond pads. In one example of this technique, the encapsulant body 128 is formed by an injection molding process which utilizes an injection cavity that is dimensioned to cover the main surfaces of the first and second semiconductor dies 108, 110 with liquified molding material without covering the outer ends 132 of the vertical interconnect structures 126. After performing this initial injection molding process, further processing steps may be performed. These steps may include cleaning steps, planarization steps to planarize the exposed outer ends 132 of the vertical interconnect structures 126 and/or further molding steps to form additional portions of the encapsulant body 128.

Figure 5:
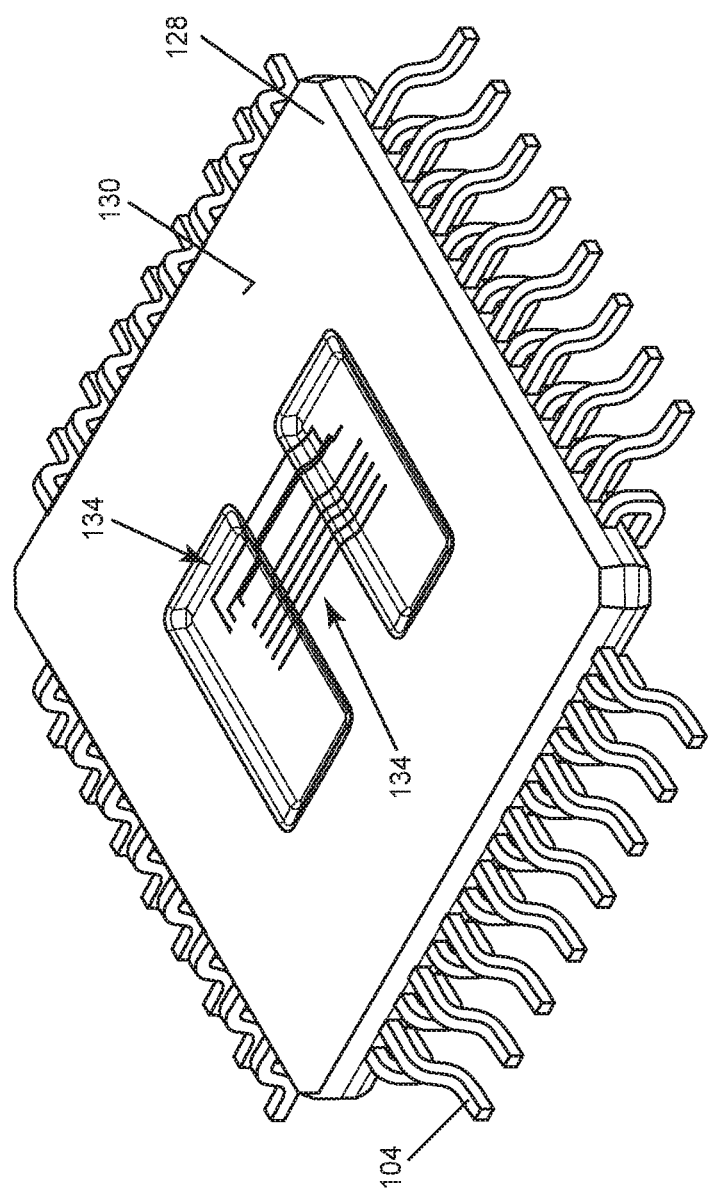
FIG. 5 illustrates performing a laser activation process that forms laser activated regions in the upper surface of the encapsulant body.

Referring to FIG. 5, a laser activation process is performed on the upper surface 130 of the encapsulant body 128. The laser activation process includes directing a laser beam on the laser-activatable mold compound that is present at the upper surface 130 of the encapsulant body 128. The energy from the laser beam creates laser-activated regions 134 in the encapsulant body 128. As used herein, a "laser-activated region" refers to a region of laser-activatable mold compound has reacted with a laser beam such that organic metal complexes are present at the surface of the laser-activatable mold compound and are capable of acting as a nuclei for metal plating process, examples of which will be described in further detail below. By contrast, the portions of the laser-activatable mold compound that are not exposed to a laser beam do not have exposed metal complexes that are capable of acting as a nuclei during a metal plating process.

Figure 6:
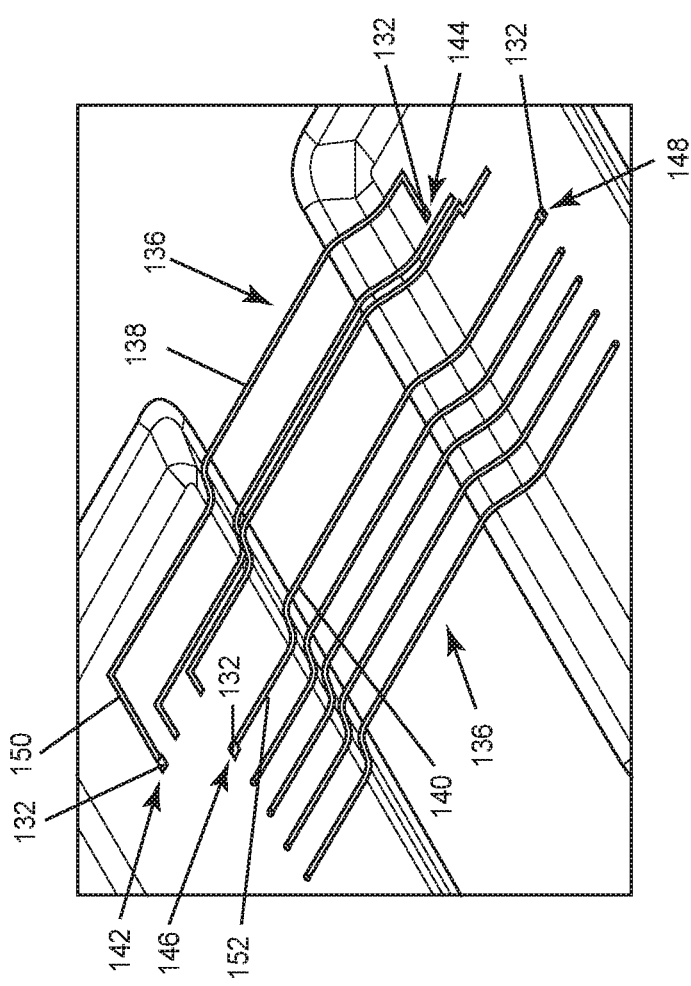
FIG. 6 illustrates performing a plating process that forms conductive tracks in the laser activated regions of the encapsulant body.

Referring to FIG. 6, a plating process is performed on the semiconductor device. The plating process forms conductive material in the laser-activated regions 134 of the mold compound without substantially forming the conductive material in inactivated regions of the laser-activatable mold compound. This means that the vast majority of metal (e.g., greater than 95%, 99% etc.) formed by the plating process forms in the laser-activated regions 134. Moreover, the conductive material formed in the laser-activated regions 134 forms a defined, conductive track that is capable of carrying an electrical current.

Generally speaking, the plating process may be any metal plating process that utilizes a seed metal as a basis for depositing metal thereon. In one example, the plating process is an electroless liquid plating process. According to this technique, the semiconductor device is submerged in a chemical bath that contains metal ions (e.g., CU+ ions, Ni+ ions, Ag+ ions, etc.) that react with the organic metal complexes in the later activated regions, thereby forming a complete layer of the element from the chemical bath. The plating process may begin with a cleaning step to remove laser debris and may be followed by an additive build-up of plated metal using the chemical bath. Optionally, additional metal coatings e.g., coatings containing Ni, Au, Sn, Sn/Pb, Ag, Ag/Pd, etc., may be applied on the deposited metal after the plating process.

As a result of the laser activation and plating steps described above, a number of conductive tracks 136 are formed in the laser-activated regions 134 of the laser-activatable mold compound. These conductive tracks 136 can be used to provide electrical connections between the terminals of semiconductor dies encapsulated within the encapsulant body 128. As shown, the conductive tracks 136 are formed to extend across the portion of the encapsulant material that fills the gap between the first and second semiconductor dies 108, 110 and thus provide a lateral electrical connection mechanism. More generally, these conductive tracks 136 can be formed in any location of the encapsulant body 128 that includes laser-activatable mold compound.

According to an embodiment, a first one 138 of the conductive tracks 136 electrically connects the first conductive pad 118 of the first semiconductor die 108 (shown in FIG. 2) to the second conductive pad 120 of the second semiconductor die 110 (shown in FIG. 2). In this case, the first one 138 of the conductive tracks 136 forms an electrical connection between a first one 142 of the vertical interconnect structures 126 that is disposed on the first conductive pad 118 and a second one 144 of the vertical interconnect structures 126 that is disposed on the second conductive pad 120. Similarly, a second one 140 of the conductive tracks 136 forms an electrical connection between a third one 146 of the vertical interconnect structures 126 that is disposed on the third conductive pad 122 (shown in FIG. 2) and a fourth one 148 of the vertical interconnect structures 126 that is disposed on the fourth conductive pad 124 (shown in FIG. 2). In the depicted embodiment, these conductive tracks 136 form a complete electrical connection between the exposed outer ends 132 of two vertical interconnect structures 126. Alternatively, other conductive structures (e.g., bond wires, clips, via structures, etc.) can be part of an electrical connection the exposed outer ends 132 of two vertical interconnect structures 126.

More generally, any number of the conductive tracks 136 can be formed in the upper surface 130 of the encapsulant body 128 to provide electrical connections between two or more semiconductor dies encapsulated within the encapsulant body 128. These conductive tracks 136 can provide separate electrical nodes, e.g., in the case of the first and second ones 138, 140 of the conductive tracks 136 as described above, or can be part of a single electrical node, e.g., for increased current carrying capability.

Advantageously, the laser structuring technique described herein allows the conductive tracks 136 to be formed as narrow width and/or tight pitch structures. As the geometry of the conductive tracks 136 is correlated to the width of a laser beam, these structures can be formed at a high degree of resolution. Moreover, the laser technique provides a high degree of flexibility with respect to the geometry of the conductive tracks 136. Put another way, in comparison to conventional metallization techniques, restrictive ground rules are not needed. In an illustration of this capability, the first one 138 of the conductive tracks 136 in the depicted embodiment includes a first elongated span 150 that extends in a first direction, and the second one 140 of the conductive tracks 136 includes a second elongated span 152 that extends in a second direction that is angled relative to the first direction. That is, the first and second elongated spans 150, 152 are oriented non-parallel to one another, e.g., about perpendicular. More generally, the conductive tracks 136 formed by the laser structuring technique can be oriented any of a variety of angles, e.g., oblique, acute, etc relative to one another. Moreover, different conductive tracks 136 can have different widths, lengths, etc. Moreover, as shown, the conductive tracks 136 can be formed to extend along different planes. For example, the conductive tracks 136 shown in FIG. 5 include inclined regions that extend from recessed portions over the semiconductor dies to the portion of the encapsulant material that fills the gap between semiconductor dies. Advantageously, any of these structures can be formed without the use of expensive masks.

Figure 7:
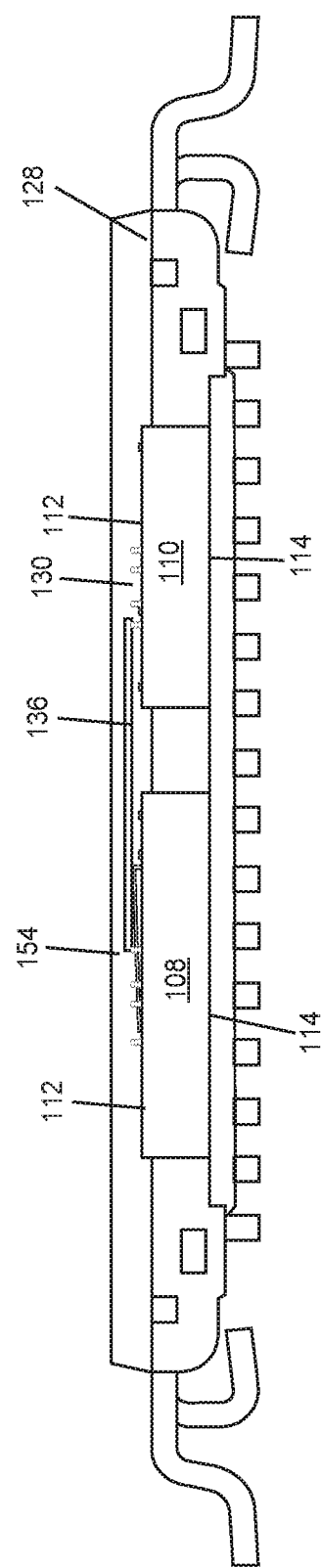
FIG. 7 illustrates forming a protective layer on the conductive tracks formed in the laser activated regions of the encapsulant body.

Referring to FIG. 7, after the conductive tracks 136 are formed in the above described manner, an optional protective layer 154 can be formed to cover some or all of the conductive tracks 136. Among other things, the protective layer 154 can prevent damage to the conductive tracks 136, e.g., from moisture, particles, physical handling of the device, etc. The protective layer 154 can be formed from an electrically insulating material that is different from material of the laser-activatable mold compound. Examples of these materials include epoxy-based plastics and diamond based materials, to name a few.

Figure 8:
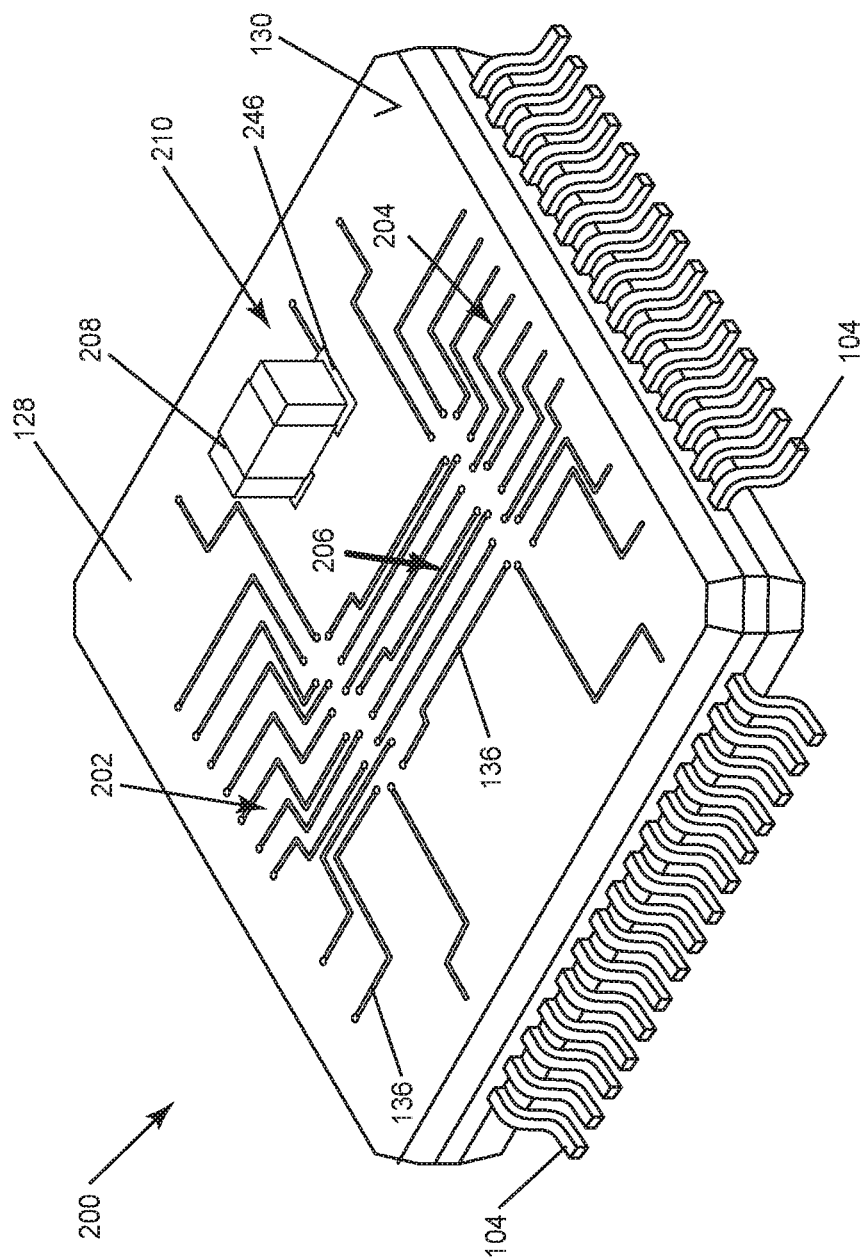
FIG. 8 illustrates a plan view of a semiconductor package with laser activated conductive tracks that form interconnections to package leads, according to an embodiment.

Referring to FIG. 8, a semiconductor package 200 is depicted, according to another embodiment. The semiconductor package 200 includes the carrier structure 100, first and second semiconductor dies 108, 110, conductive tracks 136, and encapsulant body 128 as previously described. In this embodiment, additional ones of the conductive tracks 136 are formed to provide different electrical connections than the connections of the previously described embodiments. More particularly, the semiconductor package 200 includes a first group 202 of the conductive tracks 136 that form part of a direct electrical connection between terminals of the first semiconductor die 108 and individual package leads 104, and a second group 204 of conductive tracks 136 that form part of a direct electrical connection between terminals of the second semiconductor die 110 and individual package leads 104. Hence, these first and second groups 202, 204 of conductive tracks 136 provide die-lead interconnections. The embodiment of FIG. 8 additionally includes a third group 206 of the conductive tracks 136 providing connections between the first and second semiconductor dies 108, 110, e.g., the first, second 138, 140, 146 and 148, as previously described. In other embodiments, the third group 206 of conductive tracks 136 may be omitted, and alternate techniques can be used to provide intra-chip connections (if necessary).

According to an embodiment, the semiconductor package 200 includes a discrete component 208 that is mounted on the upper surface 130 of the encapsulant body 128. The discrete component 208 can be any of a wide variety of pre-packaged electrical components that are configured to provide a defined electrical characteristic, e.g., resistance, capacitance, inductance, etc. Examples of these devices include resistors, capacitors, inductors, diodes, transistors, etc. The discrete component 208 may be a surface mount component, which refers to a component that can be mounted directly on a planar surface with terminals of the component facing and electrically contacted to corresponding bond pads.

According to an embodiment, the semiconductor package 200 includes a fourth group 210 of the conductive tracks 136 that form part of a direct electrical connection between terminals of the discrete component 208 and individual package leads 104.

Advantageously, by using a top side wiring layer formed on the upper surface 130 of the encapsulant body 128 to provide interconnections between the semiconductor dies 108, 110 and the package leads 104, a space-efficient configuration with high density interconnect capability can be obtained. The flexibility and precision of the laser structuring technique as previously described can be beneficially utilized in the context of die to lead interconnect. The conductive tracks 136 can replace existing interconnect structures, e.g., bond wires, ribbons, clips, etc. required for at least some of the die to lead interconnections. This frees up space, which can be used to increase the size of other features, such as metal clips that are used to carry high current/voltage connections. Moreover, the top side wiring layer advantageously allows for the incorporation of the discrete component 208 into the package design at minimal processing expense.

Figure 9:
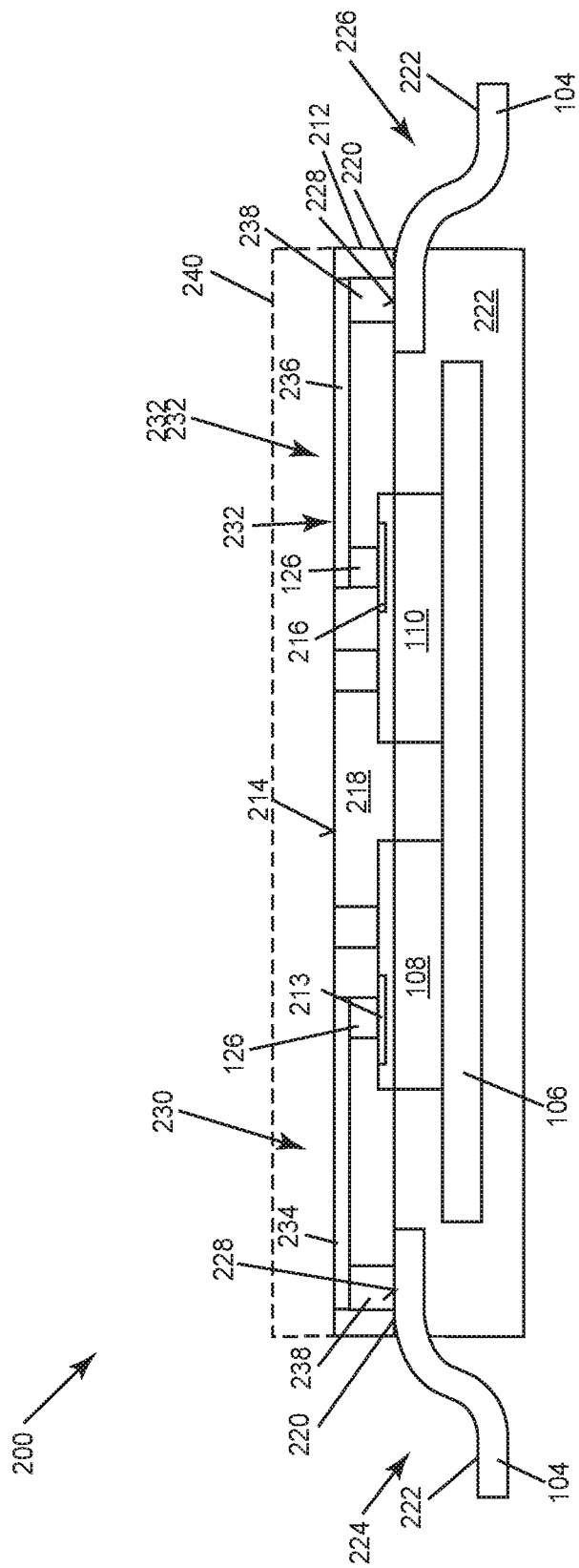
FIG. 9 illustrates a cross-sectional view semiconductor package with laser activated conductive tracks that form interconnections to package leads, according to an embodiment.

Referring to FIG. 9, a cross-sectional view of the semiconductor package 200 is shown, according to an embodiment. The semiconductor package 200 includes the first semiconductor die 108 and the second semiconductor die 110 mounted on the die pad 106 in the manner previously described. A first encapsulant body 212 encapsulates the first and second semiconductor dies 108, 110 and the die pad 106. A fifth conductive bond pad 213 is disposed on a main surface of the first semiconductor die 108 that faces an upper surface 214 of the first encapsulant body 212. Likewise, a sixth conductive bond pad 216 is disposed on a main surface of the second semiconductor die 110 that faces an upper surface 214 of the first encapsulant body 212. In the depicted embodiment, the laser activatable mold compound is implemented as a discrete layer 218 that is formed on top of a further region 220 of encapsulant material. The further region 220 of encapsulant material may include conventional encapsulant materials, e.g., epoxy, thermosetting plastic, etc. More generally, the first encapsulant body 212 can be formed with different configurations of layers wherein the laser activatable mold compound provides some or all of the encapsulant material.

The electrically conductive leads 104 of the carrier structure 100 are encapsulated by the first encapsulant body 212 such that interior ends 220 of the leads are encapsulated within the first encapsulant body 212 and outer ends 222 are exposed from the first encapsulant body 212. In the depicted embodiment, a first one 224 of the leads 104 is closest to the first semiconductor die 108 and a second one 226 of the leads 104 is closest to the second semiconductor die 110. In a single die embodiment, the first and second leads 224, 226 can extend close to opposite sides of one die. The interior ends 220 of each lead include a first surface 228, which is a substantially planar surface that faces the upper surface 214 of the first encapsulant body 212.

The semiconductor package 200 includes a first direct electrical connection 230 between the fifth bond pad 212 of the first semiconductor die 108 and the first surface 228 of the first lead 224, and a second direct electrical connection 232 between the sixth bond pad 216 of the second semiconductor die 110 and the first surface 228 of the second lead 226. The fifth and sixth bond pads 212, 216 may be any terminals (e.g., gate, source, emitter, collector, logical terminals, etc.) of the first and second semiconductor dies 108, 110, respectively. Hence, the first and second direct electrical connections 230, 232 are package-level electrical interconnections that enable electrical access to the terminals of the semiconductor dies 108, 110 and the leads 104.

The first and second direct electrical connections 230, 232 include vertical interconnect structures 126 formed on the fifth and sixth bond pads 212, 216, respectively. These vertical interconnect structures 126 may be formed according to the previously described techniques.

Additionally, the first and second direct electrical connections 230, 232 include fifth and sixth ones 234, 236 conductive tracks 136 formed on the upper surface 214 of the first encapsulant body 212. The fifth and sixth ones 234, 236 conductive tracks 136 are formed in laser activated regions of the laser activatable mold compound according to previously described techniques.

Additionally, the first and second direct electrical connections 230, 232 include conductive connectors 238 extending vertically between the first surfaces 228 of the first and second leads 224, 226, respectively. The conductive connectors 238 provide the necessary vertical connection between the conductive tracks 136, which are formed on the upper surface 214 of the first encapsulant body 212, and the connection interface of the leads (i.e., the first surfaces 228), which is underneath the conductive tracks 136. According to an embodiment, the first surfaces 228 of the first and second leads 224, 226 are disposed beneath the main surfaces of the first and second semiconductor dies 108, 110. Various techniques for forming the conductive connectors 238 will be described in further detail below.

According to an embodiment, the semiconductor package 200 includes a second electrically insulating encapsulant body 240 formed on the upper surface 214 of the first encapsulant body 212. The second electrically insulating encapsulant body covers 240 each of the conductive tracks 136 formed on the upper surface 214 of the first encapsulant body 212, and hence seals and protects these conductive tracks 136 from the exterior environment. The second electrically insulating encapsulant body 240 may include conventional encapsulant materials, e.g., epoxy-based plastics, diamond based materials, to name a few.

While the embodiment of FIG. 9 includes both the first and second semiconductor dies 108, 110, the above described technique is applicable to a semiconductor package that includes only one semiconductor die. For example, in another embodiment, the second semiconductor die 110 is omitted and the conductive tracks 136 as described herein exclusively provide chip to lead connectivity.

Referring to FIG. 10, a technique for forming the semiconductor package 200 with the first and second direct electrical connections 230, 232 as described above is depicted, according to an embodiment.

Referring to FIG. 10A, the carrier structure 100 is provided with the first and second semiconductor dies 108, 110 mounted on the die pad 106, and the vertical interconnect structures 126 are provided in the previously described manner. Subsequently, the first encapsulant body 212 is formed such that the first and second semiconductor dies 108, 110 are encapsulated and such that vertical interconnect structures 126 are exposed at the upper surface 214 of the first encapsulant body 212 in the previously described manner.

Referring to FIG. 10B, after the first encapsulant body 212 is formed, an opening 242 is formed in the first encapsulant body 212. The opening 242 is formed to extend from the upper surface 214 of first encapsulant body 212 to the first surfaces 228 of the first and second leads 224, 226. The opening 242 may be formed according to techniques such as drilling, etching, etc.

Referring to FIG. 10C, the opening 242 is filled with an electrically conductive material, e.g., copper, aluminum, tungsten, etc., or alloys thereof. As a result, an electrically conductive via structure 244 is formed in the opening 242. The opening 242 may be filled before or after forming the fifth and sixth conductive tracks 234, 236. In one embodiment, after encapsulation, the openings 242 are formed. Subsequently, the conductive tracks 136 are formed according to the plating techniques described herein. Subsequently, the opening 242 is filled with the electrically conductive material 242 to form the via structure 244.

Referring to FIG. 11, a technique for forming the semiconductor package 200 with the first and second direct electrical connections 230, 232 as described above is depicted, according to another embodiment.

Referring to FIG. 11A, the carrier structure 100 is provided with the first and second semiconductor dies 108, 110 mounted on the die pad 106, and the vertical interconnect structures 126 are provided in the previously described manner. Different to the previously described embodiment of FIG. 10, the conductive connectors 238 in this embodiment are formed before the encapsulation process. According to this technique, the conductive connector 238 is implemented as a conductive stud or pillar or vertical wire that is initially formed on the first surfaces 128 of the first and second leads 224, 226, and subsequently encapsulated by the first encapsulant body 212.

Referring to FIG. 11B, the first encapsulant body 212 is formed. The first encapsulant body 212 encapsulates the first and second semiconductor dies 108, 110, the carrier structure 100, the vertical interconnect structures 126 and the conductive connectors 238. The first encapsulant body 212 is formed such that outer ends of the vertical interconnect structures 126 are exposed from the upper surface of the first encapsulant body 212, and such that outer ends of the conductive connectors 238 are exposed from the upper surface 214 of the first encapsulant body 212. This may be done according to the previously described techniques, e.g., by planarizing the upper surface 214 of the first encapsulant body 212 until these structures become exposed.

Referring to FIG. 11C, the fifth and sixth conductive tracks 234, 236 are formed to complete the connection between the fifth and sixth bond pads 212, 216, respectively and the conductive connectors 238.

Referring to FIG. 12, various techniques for forming the conductive connector 238 as a conductive stud or pillar are shown. FIGS. 12A-12C depict a technique for forming the conductive connectors 238 as a conductive pillar. FIGS. 12D-12E depict a technique for forming the conductive connectors 238 as a conductive stud.

Referring to FIG. 12A, a patterned mask 246 is formed on the first surface 228 of a lead 104, e.g., according to known techniques. Referring to FIG. 12B, an opening in the patterned mask 246 is filled with an electrically conductive paste, e.g., a tin (Sn) paste, silver (Ag) paste, etc. Referring to FIG. 12C, the mask is subsequently removed once the paste is hardened.

Referring to FIG. 12D, a droplet 248 of liquid conductor is deposited on the first surface 228 of a lead 104. The liquid conductor may be any of a variety of curable conductors, e.g., solder, conductive paste, etc., containing conductive materials such as copper, tin, silver, etc. Referring to FIG. 12B, the droplet 248 is cured or hardened. Referring to FIG. 12C, the process may be repeated successively to form the stud bump to a desired height.

More generally, other structures suitable for forming vertical connectivity between a package lead and the upper surface of encapsulant material may be used to form the conductive connector 238.

Referring to FIG. 13, a technique for forming the semiconductor package 200 with the first and second direct electrical connections 230, 232 as described above is depicted, according to another embodiment.

Referring to FIG. 13A, the carrier structure 100 is provided with the first and second semiconductor dies 108, 110 mounted on the die pad 106, and the vertical interconnect structures 126 are provided in the previously described manner. Like the previous embodiment of FIGS. 11-12, the conductive connectors 238 in this embodiment are formed before the encapsulation process. In this embodiment, the conductive connector 238 is provided as an integral component of the leads 104. More particularly, the conductive connector 238 is a section that continuously extends away from the first surfaces 228 of the first and second leads 224, 226, respectively. Put another way, in this embodiment, the lead frame is specifically designed to include leads 104 with sections vertically extend to a plane that is at or above the plane of the main surfaces of the encapsulated semiconductor dies.

Referring to FIG. 13B, the first encapsulant body 212 is formed in a similar manner as previously described. The outer ends of the vertical interconnect structures 126 and the conductive connector 238 (a portion of the leads 104 in this case) are exposed from the upper surface 214 of the first encapsulant body 214 according to the previously described techniques, e.g., by planarizing upper surface 214 of the first encapsulant body 214.

Referring to FIG. 13C, the fifth and sixth conductive tracks 234, 236 are formed to complete the connection between the fifth and sixth bond pads 212, 216, respectively and the conductive connectors 238.

Referring to FIG. 14, a technique for forming the semiconductor package 200 with the first and second direct electrical connections 230, 232 as described above is depicted, according to another embodiment. In the previous embodiments, the conductive connector 238 extends through the first encapsulant body 212 and directly contacts a conductive track 136 at a connection point at the upper surface 214 of the first encapsulant body 212. That is, the conductive connector 238 is surrounded by the encapsulant of the first encapsulant body 212 in all lateral directions. By contrast, in the embodiment of FIG. 14, the conductive connector 238 is formed on an outer surface of the first encapsulant body 212.

Referring to FIG. 14A, the first encapsulant body 212 is formed, according to an embodiment. Different to the previous embodiments, the first encapsulant body 212 of FIG. 14 is formed to at least partially expose the first surfaces 228 of the first and second leads 224, 226. In this context, the first surfaces 228 of the first and second leads 224, 226 refers to a planar surface that is substantially parallel to the main surfaces of the first and second semiconductor dies 108, 110. Put another way, the first surfaces 228 of the first and second leads 224 are not bent portions of these leads.

According to an embodiment, the first encapsulant body 212 is formed to include a side surface 250 that extends between the upper surface 214 of the first encapsulant body 212 and the first surface 228 of the first and second leads 224, 226. In a particular embodiment, this side surface 250 is perpendicular or at least close to perpendicular (e.g., with five degrees) of perpendicular with the upper surface 214 of the first encapsulant body 212. Accordingly, the side surface 250 provides a mainly vertical plane between the first surfaces 228 of the first and second leads 224 and the upper surface 214 of the first encapsulant body 212.

Referring to FIG. 14B, after the first encapsulant body 212 is formed, a laser activation process is formed. Different to the previously described embodiments, in this embodiment the laser is applied along the side surface 250. Put another way, laser activated regions 252 are formed to extend continuously along the upper surface 214 and down the side surface 250. In this embodiment, the laser activated regions 252 of the first encapsulant body 212 are formed to extend completely to reach the first surfaces 228 of the first and second leads 224, 226.

Referring to FIG. 14O, after the laser activation process is performed, a plating process is performed to form the first and second tracks 234, 236 in the laser activated regions 252. This may be done according to any of the previously described plating techniques. As a result, the first and second tracks 234, 236 provide both the lateral and vertical extension necessary to complete the connection between the and the fifth and sixth bond pads 212, 216 and the first and second leads 224, 226, respectively.

Referring again to FIG. 8, as previously explained, the semiconductor package 200 may include a discrete component 208 that is mounted on the upper surface 130 of the encapsulant body 128. The terminals of this discrete component 208 electrically connect with bond pads 246. These bond pads 246 are connected to a fourth group 210 of conductive tracks 136. The fourth group 210 of conductive tracks 136 can be configured to provide direct electrical connections to the package leads 104 according to any of the techniques described herein. Alternatively, the fourth group 210 of conductive tracks 136 can be connected to terminals of the first and second semiconductor dies 108, 110, according to any of the techniques described herein.

While a particular lead-frame style package is used in the illustrated embodiments, the laser connection techniques described herein are more generally applicable to a wide variety of package types. These package types include flat packages, leaded packages, leadless packages, and surface mount type packages, to name a few. In any of these examples, a laser-activatable mold compound can be used in part or in whole as encapsulant material and structured according to the techniques described herein.

The "upper surface" of the encapsulant body as described herein refers to a surface of the encapsulant body that is disposed above one or more semiconductor dies such that upper surfaces of the covered semiconductor die face the upper surface of the encapsulant body. The "upper surface" of the encapsulant body is not necessarily an outermost exposed surface of the packaged device. For example, as shown in the embodiment of FIG. 7, the upper surface 130 of the encapsulant body is covered by a protective layer. Additionally or alternatively, additional layers of encapsulant material may be formed over at least part of an "upper surface" of an encapsulant body such that the conductive tracks 136 136 described herein are embedded within encapsulant material.

The term "electrically connected," "directly electrically connected" and the like describes a permanent low-impedance connection between electrically connected elements, for example a direct contact between the relevant elements or a low-impedance connection via a metal and/or a highly doped semiconductor.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A packaged semiconductor device, comprising:
an electrically insulating first encapsulant body comprising an upper surface;
a first semiconductor die encapsulated within the first encapsulant body, the first semiconductor die comprising a main surface with a first conductive pad that faces the upper surface of the first encapsulant body;
a plurality of electrically conductive leads, each of the leads comprising interior ends that are encapsulated within the first encapsulant body and outer ends that are exposed from the first encapsulant body; and
a first direct electrical connection between the first conductive pad and the interior end of a first lead from the plurality of electrically conductive leads,
wherein the first direct electrical connection comprises a first conductive track that is formed in the upper surface of the first encapsulant body,
wherein the first encapsulant body comprises a laser activatable mold compound, and
wherein the first conductive track is formed in a first laser activated region of the laser activatable mold compound.

2. The packaged semiconductor device of claim 1, wherein the interior end of the first lead comprises a first surface that is vertically below the main surface of the first semiconductor die, and wherein the first direct electrical connection comprises a conductive connector extending vertically between the first surface of the first lead and the upper surface of the first encapsulant body.

3. The packaged semiconductor device of claim 2, wherein the conductive connector extends through the first encapsulant body and directly contacts the first conductive track at the upper surface of the first encapsulant body.

4. The packaged semiconductor device of claim 3, wherein the first encapsulant body is formed to include an opening between the upper surface of the encapsulant and the first surface of the first lead, and wherein the conductive connector comprises a via formed in the opening.

5. The packaged semiconductor device of claim 3, wherein the conductive connector comprises any one of a conductive stud, pillar or vertical wire.

6. The packaged semiconductor device of claim 2, wherein the first encapsulant body is formed to include a side surface that extends between the upper surface of the first encapsulant body and the first surface of the first lead, and wherein the conductive connector is an extension of the first conductive track that is formed on the side surface.

7. The packaged semiconductor device of claim 2, wherein the first conductive connector is an integrally formed section of the lead that vertically extends from the first surface of the first lead to the upper surface of the first encapsulant body.

8. The packaged semiconductor device of claim 1, further comprising a second electrically insulating encapsulant body formed on the upper surface of the first encapsulant body, wherein the second encapsulant body covers the first conductive track.

9. The packaged semiconductor device of claim 1, further comprising:
a second semiconductor die encapsulated within the first encapsulant body and mounted laterally side by side with the first semiconductor die, the second semiconductor die comprising a main surface with a second conductive pad that faces the upper surface of the first encapsulant body;
a second direct electrical connection between the second conductive pad and the interior end of a second lead from the plurality of electrically conductive leads,
wherein the second direct electrical connection comprises a second conductive track that is formed in the upper surface of the first encapsulant body, and
wherein the second conductive track is formed in a second laser activated region of the laser activatable mold compound.

10. The packaged semiconductor device of claim 1, further comprising:
a discrete passive device mounted on the upper surface of the first encapsulant body,
a third direct electrical connection between the discrete passive device and the interior end of a third lead from the plurality of electrically conductive leads,
wherein the third direct electrical connection comprises a third conductive track that is formed in the upper surface of the first encapsulant body, and
wherein the third conductive track is formed in a third laser activated region of the laser activatable mold compound.

11. The packaged semiconductor device of claim 1, further comprising:
mounting a discrete passive device on the upper surface of the first encapsulant body,
forming a third direct electrical connection between the discrete passive device and the interior end of a third lead from the plurality of electrically conductive leads,
wherein the third direct electrical connection comprises a third conductive track that is formed in the upper surface of the first encapsulant body, and
wherein the third conductive track is formed in a third laser activated region of the laser activatable mold compound.

12. A method of forming a packaged semiconductor device, comprising:
providing a first semiconductor die comprising a main surface with a first conductive pad;
providing a plurality of electrically conductive leads;
forming an electrically insulating first encapsulant body that encapsulates the first semiconductor die and the plurality of electrically conductive leads such the first conductive pad faces an upper surface of the first encapsulant body, and such that interior ends of the leads are encapsulated within the first encapsulant body and outer ends of the leads are exposed from the first encapsulant body; and
forming a first direct electrical connection between the first conductive pad and the interior end of a first lead from the plurality of electrically conductive leads,
wherein forming the first direct electrical connection comprises forming a first conductive track in the upper surface of the first encapsulant body,
wherein the first encapsulant body comprises a laser activatable mold compound, and
wherein the first conductive track is formed in a first laser activated region of the laser activatable mold compound.

13. The method of claim 12, wherein forming the first conductive track comprises:
directing a laser on the laser activatable mold compound thereby forming the first laser activated region; and
performing a plating process that forms conductive material in the first laser activated region.

14. The method of claim 13, wherein the interior end of the first lead comprises a first surface that is vertically below the main surface of the first semiconductor die, and wherein forming the first direct electrical connection comprises providing a conductive connector extending vertically between the first surface of the first lead and the upper surface of the first encapsulant body.

15. The method of claim 14, wherein the conductive connector is provided within the first encapsulant body, and wherein forming the first conductive track comprises forming the first laser activated region to meet an exposed end of the conductive connector at the upper surface of the first encapsulant body.

16. The method of claim 15, wherein providing the conductive connector comprises forming a conductive bump or pillar or vertical wire on the first surface of the first lead before forming the first encapsulant body, and wherein forming the first encapsulant body comprises encapsulating the conductive bump or pillar or vertical wire.

17. The method of claim 15, wherein providing the conductive connector comprises, after forming the first encapsulant body, drilling an opening in the first encapsulant body that extends from the upper surface of the first encapsulant body to the first surface of the first lead before forming the first conductive track, and filling the opening with a conductive via after forming the first conductive track.

18. The method of claim 14, wherein providing the conductive connector comprises providing the first lead to include an integrally formed section that vertically extends above the first surface of the first lead, and wherein forming the first conductive track comprises forming the first laser activated region to meet an exposed end of the integrally formed section at the upper surface of the first encapsulant body.

19. The method of claim 14, wherein the first encapsulant body is formed such that a side surface of the first encapsulant body extends between the upper surface of the first encapsulant body and the first surface of the first lead, wherein forming the first conductive track comprises forming the first laser activated region to extend from the upper the first encapsulant body to the first surface of the first lead, and wherein the conductive connector is provided by an extension of the first conductive track that is formed on the side surface.

20. The method of claim 12, further comprising:
providing a second semiconductor die mounted on a carrier laterally side by side with the first semiconductor die, the second semiconductor die comprising a main surface with a second conductive pad;
encapsulating the second semiconductor die with the first encapsulant body;
forming a second direct electrical connection between the second conductive pad and the interior end of a second lead from the plurality of electrically conductive leads,
wherein the second direct electrical connection comprises a second conductive track that is formed in the upper surface of the first encapsulant body, and
wherein the second conductive track is formed in a second laser activated region of the laser activatable mold compound.

* * * * *

UNITED STATES PATENT AND TRADEMARK OFFICE
CERTIFICATE OF CORRECTION

PATENT NO. : 10,796,981 B1
APPLICATION NO. : 16/413059
DATED : October 6, 2020
INVENTOR(S) : C. Chiang et al.

Page 1 of 1

It is certified that error appears in the above-identified patent and that said Letters Patent is hereby corrected as shown below:

In the Claims

Column 20, Line 3 (Claim 12, Line 8), please change "such the" to -- such that the --.
Column 20, Lines 66 & 67 (Claim 19, Lines 6 & 7), please change "upper the" to -- upper surface of the --.

Signed and Sealed this
Twelfth Day of January, 2021

Andrei Iancu
*Director of the United States Patent and Trademark Office*